(12) United States Patent
Fleischhacker et al.

(10) Patent No.: US 7,116,159 B2
(45) Date of Patent: Oct. 3, 2006

(54) METHOD AND APPARATUS FOR ADJUSTING AN ACTIVE FILTER

(75) Inventors: Christian Fleischhacker, Villach (AT); Günter Koder, Villach (AT); Francesco Labate, Villach (AT); Michael Staber, Villach (AT); Hubert Weinberger, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/697,418

(22) Filed: Oct. 30, 2003

(65) Prior Publication Data

US 2004/0124911 A1 Jul. 1, 2004

Related U.S. Application Data

(63) Continuation of application No. PCT/EP02/04528, filed on Apr. 24, 2003.

(51) Int. Cl.
*H03K 5/00* (2006.01)

(52) U.S. Cl. ................................ 327/554; 327/337
(58) Field of Classification Search ........ 327/551–559, 327/336, 337
See application file for complete search history.

(56) References Cited

U.S. PATENT DOCUMENTS

| | | | | |
|---|---|---|---|---|
| 4,733,205 | A | | 3/1988 | Hughes ...................... 333/172 |
| 5,187,445 | A | * | 2/1993 | Jackson ...................... 327/553 |
| 5,245,646 | A | * | 9/1993 | Jackson et al. ................ 377/2 |
| 5,532,922 | A | | 7/1996 | Wacker et al. ................ 700/32 |
| 6,084,465 | A | * | 7/2000 | Dasgupta .................... 327/554 |
| 6,239,654 | B1 | | 5/2001 | Yamamoto .................... 330/9 |
| 6,417,727 | B1 | * | 7/2002 | Davis ......................... 327/553 |
| 6,628,163 | B1 | * | 9/2003 | Dathe et al. ................. 327/553 |
| 6,714,066 | B1 | * | 3/2004 | Gorecki et al. .............. 327/553 |

FOREIGN PATENT DOCUMENTS

| | | |
|---|---|---|
| DE | 36 31 827 A1 | 3/1988 |
| DE | 42 24 771 A1 | 2/1994 |
| DE | 43 21 120 C1 | 9/1994 |
| EP | 0 421 423 A2 | 4/1991 |
| WO | WO 00/08870 | 2/2000 |
| WO | WO 00/41045 | 7/2000 |

OTHER PUBLICATIONS

Don Lancaster's Tech Musings, Feb. 1997.
Shigeru Yamashita; Hiroshi Sawada; and Akira Nagoya, 'An Efficient Framework of Using Various Decomposition Methods to Synthesize LUT Networks and Its Evaluation,' IEEE, pp. 253-258, 2000.

* cited by examiner

*Primary Examiner*—Minh Nguyen
(74) *Attorney, Agent, or Firm*—Holme Roberts & Owen LLP

(57) ABSTRACT

An adjustable filter, particularly for use as an antialiasing filter in digital telecommunications networks, includes adjustable capacitors which determine frequency response for the purpose of accurate alignment with a particular cut-off frequency. The active filter includes, in line with the invention, a control device with a measuring device for ascertaining the actual cut-off frequency of the filter. On the basis of the ascertained actual cut-off frequency of the filter and the information about the nominal cut-off frequency which is to be set, an adjustment parameter for the adjustable capacitor is selected from a memory arrangement. This adjustment parameter is used to adjust the adjustable capacitor such that the desired nominal cut-off frequency is obtained and, at the same time, the alignment is performed to achieve the nominal cut-off frequency with sufficient accuracy.

19 Claims, 1 Drawing Sheet

METHOD AND APPARATUS FOR ADJUSTING AN ACTIVE FILTER

CROSS-REFERENCE TO RELATED APPLICATIONS

This application is a continuation of the Patent Cooperation Treaty application PCT/EP02/04528, having an international filing date of Apr. 24, 2003, which application is hereby incorporated by reference in its entirety, and to which priority is claimed, and which claims priority to German Application Serial No. DE 101 21 517.7, filed on May 3, 2001.

BACKGROUND OF THE INVENTION

1. The Field of the Invention

The present invention relates to a method and a circuit arrangement for adjusting an active filter in determining frequency response.

2. The Relevant Technology

Active filters are used, for example, in telecommunication networks. In this case, active filters are used, particularly for digital transmission methods, as input and output filters upstream of an analogue-digital converter and downstream of a digital-analogue converter, respectively. In a digital technology application, it is important for a particular nominal frequency response to be observed on the basis of the clock frequencies used in the digital system. If the elements used in an active filter to determine frequency response are capacitors, inter alia, which disadvantageously vary greatly in production, it is generally necessary to have a means of alignment for setting the frequency response. Normally, such active filters for use in telecommunication networks are integrated in a semiconductor together with an alignment circuit.

By way of example, VDSL systems require an active low-pass filter whose cut-off frequency needs to be able to be set to one of a plurality of frequencies between 8 and 12.44 MHz, the permissible tolerance being ±5% of the frequency value. If a set of capacitors which determine frequency response is now used for each adjustable nominal frequency together with the respective alignment circuit required, the result is disadvantageously a very high level of circuit complexity, whose scope entails further drawbacks, such as parasitic capacitances.

BRIEF SUMMARY OF THE INVENTION

The present invention provides a circuit arrangement and a method for adjusting an active filter of the type mentioned initially which allow one frequency response from a plurality to be set with a high level of accuracy given little circuit complexity.

The inventive method involves the use of a memory arrangement which contains parameters for varying the adjustable capacitor to determine frequency response. The selection of the parameters takes into account the intended nominal cut-off frequency or the nominal frequency response and a measure of the actual frequency response of the active filter. The adjustment is advantageously possible in one work step, so that it is not necessary to first set the nominal frequency response and then to align it in a further step.

Advantageously, the measure of the frequency response of the filter is ascertained using a reference capacitor whose value is in a known ratio to the value of the filter's capacitors which determine frequency response. In this case, a measure of the value of the reference capacitor can be ascertained. This value can be used to infer the value of the capacitor in the filter or to infer the frequency response of the filter. This means that it is not necessary for the filter to have a circuit for determining the measure of the frequency response connected to it which might impair the operation of the filter, for example, as a result of parasitic capacitances or contact resistances of added switches.

The use of a reference capacitor is particularly appropriate when at least all of the capacitors are integrated on a chip or semiconductor. In which case, the absolute values of the capacitors can vary but the ratio of the values of the various capacitors to one another is easily reproducible and accurately determinable or is known. Thus, provision can be made, in particular, for all the capacitors to be formed from standard capacitors of the same value by connecting at least one standard capacitor in, parallel or in series. In particular, the ratio of the reference capacitor to another capacitor is determined by the number and type of the combination of the respective interconnected standard capacitors.

Advantageously, a time constant is determined as a measure of the frequency response. This time constant is able to be ascertained particularly easily by means of time measurement. Therefore, by way of example, a step signal can be connected to the input of the filter or to the reference capacitor. In addition, a measurement may be obtained from the time taken until the output signal from the filter or a voltage across the reference capacitor reaches a particular value.

Normalizing the time constant to a particular measurement frequency allows the actual frequency response to be measured at any frequencies regardless of the nominal cut-off frequency.

If the memory arrangement used is an addressable table memory, then it is a particularly simple matter to select the adjustment parameters for the adjustable capacitor. The adjustment parameters are selected by splitting a multidigit address range in the table memory and addressing another part using the selection of the nominal cut-off frequency and addressing the other part using the measure of the actual frequency response. By way of example, in an address range comprising 10 bits, 3 bits can be used to select a particular nominal filter frequency, where a total of eight nominal filter frequencies would be selectable. The remaining 7 bits can be used to input the measure of the actual frequency response.

In this case, the adjustment parameters stored in the memory arrangement allow the capacitor to determine the frequency response to be adjusted with sufficient accuracy. The accurate adjustment makes the desired nominal frequency response and the alignment possible.

Advantageously, the adjustable capacitor has a plurality of series circuits connected in parallel with each including a single capacitor and a switch. The total capacitance of this circuit arrangement is obtained from the sum of the single capacitors connected in series with closed switches. In this context, provision can be made for the values of the single capacitors to behave as integer powers of two towards one another. Thus, a binary word stored as an adjustment parameter can advantageously be used directly for closing the switches or for adjusting the capacitor. The adjustable capacitor can also have a base capacitor which has a circuit arrangement of variable capacitance connected in parallel with it, which means that the adjustment range for the adjustable capacitor can be smaller.

For adjusting the capacitor, provision can be made for the measurement of the actual frequency response and the subsequent selection of an adjustment parameter to be carried out a plurality of times in order to achieve a higher level of accuracy. Particularly, the measurements are useful in those cases in which the effect of an adjustment action for the adjustable capacitor cannot be determined in advance. This can be the case, by way of example, in parallel-connected and individually connectable single capacitors, on account of manufacturing tolerances in the single capacitors. Should the connected single capacitor have a different value from the one taken as a basis for the adjustment parameter in such a case, then the difference can be ascertained in a second measurement and the adjustment can be repeated.

If the active filter is integrated in a semiconductor together with all of the components required for carrying out the inventive method, then the costs therefor can be reduced. Particularly, the cost is further reduced if the inventive circuit arrangement is required in very large quantities, for example, when used in a telecommunication network.

These and other objectives and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
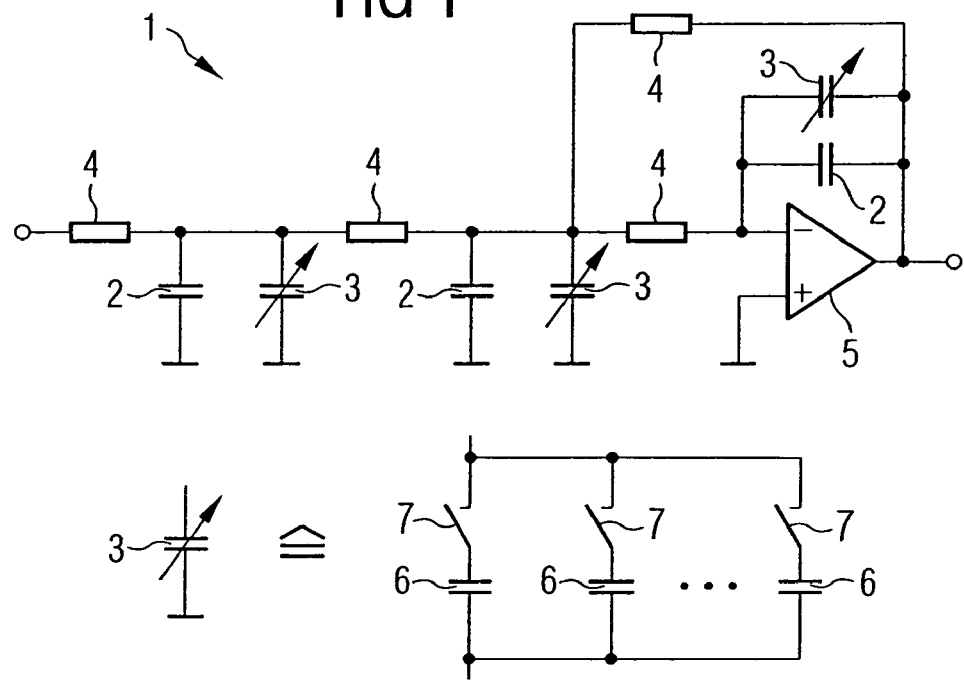
FIG. 1 illustrates the design of an active filter with the components which determine frequency response.

FIG. 1 shows a third-order Chebyshev low-pass filter. In this regard, the filter 1 has an operational amplifier 5 and, for the purpose of external connection, resistors 4 and capacitors 2, 3 which determine the frequency response of the filter 1. The capacitors 2 are each fixed capacitors, whereas the capacitors 3 are adjustable.

The adjustable capacitors 3 each comprise a parallel circuit comprising single capacitors 6 which are connected in series with switches 7. The single capacitors 6 in an adjustable capacitor have different values which behave like integer powers of two towards one another.

The value of the base capacitor 2 is proportioned such that, when the adjustable capacitor 3 is adjusted to the smallest possible value, i.e. when all the switches 7 are opened, a cut-off frequency for the filter 1 is achieved which, taking into account usual manufacturing tolerances, is above the highest cut-off frequency which can be set.

The filter 1 shown in FIG. 1 is provided for use in a VDSL system and is intended to be used there as an input or output filter upstream of an analogue-digital converter or downstream of a digital-analogue converter.

Figure 2:
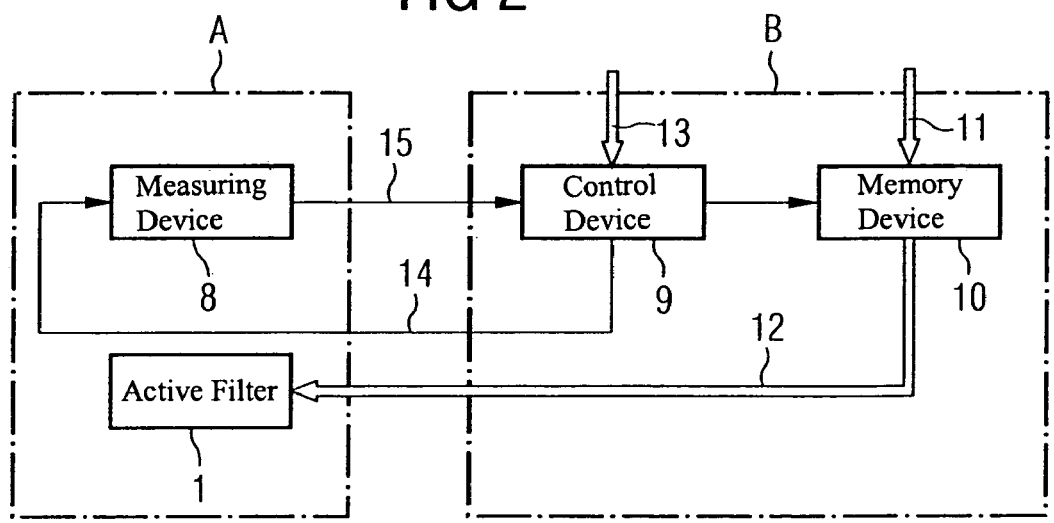
FIG. 2 is a block diagram illustrating the active filter together with the components required for adjustment.

FIG. 2 shows a block diagram of the active filter 1 together with the components which are required for carrying out the method. The components are divided into an analogue part A and a digital part B. The analogue part A has the active filter 1 together with a device 8 for determining a measure of the frequency response of the filter 1. The digital part B has a control device 9 and a memory device 10. The control device 9 receives a clock signal via a clock input 13. In addition, the control device 9 is connected by means of a start line 14 and a stop line 15 to the measuring device 8, which it can use to initiate measurement of the actual frequency response and to receive a report of the ascertained measure of the actual frequency response.

As the measure of the frequency response of the filter 1, a time constant is ascertained. To this end, the control device 9 sends a signal via the start line 14 to the measuring device 8, which then starts the measurement by applying a step signal to the input of the filter 1. At the same time, the control device 9 starts a counter which counts upwards in time with the frequency applied via the line 13.

In the meantime, the measuring device 8 monitors the output of the filter 1 for arrival at a particular voltage value. As soon as this value is reached, the measuring device 8 uses the stop line 15 to send a signal to the control device 9, which then stops the counter and normalizes the count reached to the frequency of the applied clock signal. This normalized count then corresponds to a time constant which is supplied to the memory arrangement 10 via a line.

At the same time, the memory arrangement 10 is notified via an input line 11 about which nominal cut-off frequency is to be set. The information which is on the memory arrangement 10 about the nominal cut-off frequency which is to be set and the normalized time constant are logically combined in the memory arrangement 10 to form a multi-digit address signal for a table memory. This table memory stores, for every combination of each adjustable nominal filter frequency and for the possible values of the ascertained digital time constant, an adjustment parameter for adjusting the capacitors 3. If the intention is to be able to set six different filter frequencies, for example, and if the digital value of the normalized time constant is in a range from 0 to 999, then 6000 different adjustment parameters are stored in the memory arrangement 10. The memory arrangement is therefore used as a look-up table for the adjustment parameters.

In this case, the involvement for logically combining the ascertained time constant and for the information about the nominal cut-off frequency for selecting the adjustment parameter, can be simplified by transmitting the information about the nominal filter frequency and about the ascertained time constant, in each case in the form of a binary digital value, to the control device 10 and connecting it there to various lines in an address input which is several bits wide. In this way, no complex logic is required and an ordinary read-only memory can be used for the memory device 10. Since such memories are generally available only with a particular number of memory cells, memory cells are sometimes unused if the number of combinations comprising the number of nominal filter frequencies and the possible time constants is smaller than the number of memory cells.

In addition, however, it is also possible to store the adjustment parameters using a different table memory which is used, for example, as a program store for a microcontroller or processor. This table memory can store the adjustment parameters in an unused memory area, starting at a particular start address. The address value obtained from the combination of the time constant and the information about the nominal filter frequency would, in such a case, be interpreted as an offset which is added to the start address. This option is particularly appropriate in cases in which the inventive circuit arrangement is integrated in a semiconductor which contains a program-controlled control mechanism with a table memory anyway.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for adjusting an active filter, comprising:
providing an adjustable capacitor for determining a frequency response of said filter;
determining a measure of the frequency response and receiving a nominal frequency response;
selecting an adjustment parameter from a plurality of adjustment parameters stored in a memory arrangement based on the measure of the frequency response and the nominal frequency response; and
adjusting the adjustable capacitor on the basis of the selected adjustment parameter,
wherein selecting from the memory arrangement uses an addressable table memory whose address has a word length comprising at least two digits, and at least one digit in the address word length is filled with a digital value derived from the determined measure of the frequency response, and at least one digit in the address word length is filled with a digital value which describes the nominal frequency response.

2. The method according to claim 1, wherein the measure of the frequency response of the active filter is a time constant.

3. The method according to claim 2, wherein the determined time constant is normalized to a particular value of a clock frequency used.

4. The method according to claim 1, wherein the nominal frequency response is selected from a plurality of given nominal frequency responses.

5. The method according to claim 1, further comprising a step of providing a fixed capacitor arranged in parallel with the adjustable capacitor.

6. The method according to claim 1, wherein the digital value describing the nominal frequency response is indicative of a selected nominal frequency response taken from a set of at least two nominal frequency responses.

7. The method according to claim 6, wherein the at least two nominal frequency responses have cut-off frequencies in the range from about 8 to about 12.44 MHz.

8. A circuit arrangement for filtering an electrical signal, comprising:
an active filter including at least one adjustable capacitor that determines frequency response;
a circuit to determine a measure of the frequency response of the active filter;
a memory arrangement which is adapted to store a plurality of adjustment parameters for adjusting the at least one adjustable capacitor, wherein the memory arrangement includes a table memory for storing digital values in binary form as adjustment parameters; and
a control device which is adapted to select a stored adjustment parameter depending on said determined measure of the frequency response and on a nominal frequency response fed to the circuit arrangement and to adjust the at least one adjustable capacitor on the basis of the selected adjustment parameter,
wherein the table memory includes an address word length having at least two digits, and the circuit arrangement fills at least one digit in the address word length with a digital value derived from the determined measure of the frequency response and fills at least one digit in the address word length with a digital value which describes the nominal frequency response.

9. The circuit arrangement according to claim 8, wherein the at least one adjustable capacitor includes at least one invariable base capacitor and an adjustable capacitor component.

10. The circuit arrangement according to claim 8, wherein the at least one adjustable capacitor includes a plurality of series circuits connected in parallel, which each one of the at least one adjustable capacitor comprise a single capacitor and a switch.

11. The circuit arrangement according to claim 8, wherein the circuit arrangement is arranged to determine a time constant as a measure of the frequency response.

12. The circuit arrangement according to claim 11, wherein the circuit arrangement is arranged to normalize the time constant to a particular value of a clock frequency used when determining the time constant.

13. The circuit arrangement according to claim 8, wherein the components of the circuit arrangement are integrated into a semiconductor.

14. The circuit arrangement according to claim 8, further including at least one reference capacitor having a value in a known ratio to the value of at least one capacitor which determines frequency response, wherein the circuit for determining a measure of the frequency response of the filter is arranged to ascertain a measure of the value of the reference capacitor, and the control device is arranged to use the measure of the value of the reference capacitor instead of the measure of the frequency response of the active filter.

15. The circuit arrangement according to claim 14, wherein the reference capacitor and the capacitor which determines frequency response are made up of capacitors of the same value.

16. The apparatus according to claim 8, wherein the nominal frequency response is selected from a plurality of given nominal frequency responses.

17. The circuit arrangement according to claim 8, further comprising a fixed capacitor arranged in parallel with the adjustable capacitor.

18. The circuit arrangement according to claim 8, wherein the digital value describing the nominal frequency response is indicative of a selected nominal frequency response taken from a set of at least two nominal frequency responses.

19. The circuit arrangement according to claim 18, wherein the at least two nominal frequency responses have cut-off frequencies in the range from about 8 to about 12.44 MHz.

* * * * *

UNITED STATES PATENT AND TRADEMARK OFFICE
CERTIFICATE OF CORRECTION

PATENT NO. : 7,116,159 B2
APPLICATION NO. : 10/697418
DATED : October 3, 2006
INVENTOR(S) : Christian Fleischhacker et al.

Page 1 of 1

It is certified that error appears in the above-identified patent and that said Letters Patent is hereby corrected as shown below:

On The
Title page:

Item [75], "Christian Fleischhacker, Villach (AT)," should read -- Christian Fleischhacker, Pischeldorf (AT)--.

On The Title Page
Item [75], "Gunter Koder, Villach (AT)," should read -- Gunter Koder, Strau (AT)--.

On The Title Page
Item [75], "Hubert Weinberger, Villach (AT)," should read -- Hubert Weinberger, Soboth (AT)--.

On The Title Page
Item [63], "Continuation of application No. PCT/EP02/04528, filed on Apr. 24, 2003" should read --Continuation of application No. PCT/EP02/04528, filed on Apr. 24, 2002--.

On The Title Page Item 30 should be added: --Foreign Application Priority Data: May 3, 2001 (DE) ........101 21 517.7--.

Column 1, Line 9, the date "April 24, 2003" should read to --April 24, 2002--.

Signed and Sealed this

Twelfth Day of June, 2007

JON W. DUDAS
*Director of the United States Patent and Trademark Office*